US012737523B2

(12) United States Patent
Verma et al.

(10) Patent No.: US 12,737,523 B2
(45) Date of Patent: Sep. 15, 2026

(54) AUTOMATED MULTI-STAGE DESIGN FLOW BASED ON FINAL QUALITY OF RESULT

(71) Applicant: Synopsys, Inc., Mountain View, CA (US)

(72) Inventors: Piyush Verma, Sunnyvale, CA (US); Joseph Robb Walston, Durham, NC (US); Robert Lawrence Walker, Boulder, CO (US); Pranay Prakash, Fremont, CA (US); Jagat Patel, Palo Alto, CA (US); Mark Thomas Williams, Los Gatos, CA (US); Navneedh Shivakumar Maudgalya, San Francisco, CA (US); Benoit Claudel, Grenoble (FR)

(73) Assignee: Synopsys, Inc., Sunnyvale, CA (US)

( * ) Notice: Subject to any disclaimer, the term of this patent is extended or adjusted under 35 U.S.C. 154(b) by 731 days.

(21) Appl. No.: 18/192,195

(22) Filed: Mar. 29, 2023

(65) Prior Publication Data

US 2024/0330562 A1 Oct. 3, 2024

(51) Int. Cl.
*G06F 30/396* (2020.01)
*G06F 30/373* (2020.01)

(52) U.S. Cl.
CPC .......... *G06F 30/396* (2020.01); *G06F 30/373* (2020.01)

(58) Field of Classification Search
USPC .......................................................... 716/131
See application file for complete search history.

(56) References Cited

U.S. PATENT DOCUMENTS 12,260,161 B2 * 3/2025 Huang ................ G06F 30/3308
2012/0331436 A1 * 12/2012 Formato .................. H01Q 9/42 716/132

OTHER PUBLICATIONS

Liang, R. et al. "FlowTuner: A multi-stage EDA flow tuner exploiting parameter knowledge transfer," IEEE/ACM International Conference on Computer Aided Design, Nov. 1, 2021, pp. 1-9.
PCT International Search Report and Written Opinion, PCT Application No. PCT/US2024/013625, Jun. 10, 2024, 13 pages.
Xie, Z. et al. "FIST: A feature-importance sampling and tree-based method for automatic design flow parameter tuning," 25th Asia and South Pacific Design Automation Conference, Jan. 13, 2020, pp. 1-7.
Murali et al., "A PPAStudy of Reinforced Placement Parameter Autotuning: Pseudo-3D vs. True-3D Placers", Acm Transactions On Design Automation Of Electronic Systems, vol. 28, No. 5, Sep. 2023, pp. 1-22.

* cited by examiner

*Primary Examiner* — Bryce M Aisaka
(74) *Attorney, Agent, or Firm* — Fenwick & West LLP

(57) ABSTRACT

A plurality of design iterations are executed for a flow to design a circuit. The design flow includes a sequence of at least two stages. Each stage produces an output design of the circuit from an input design of the circuit, in accordance with parameters for that stage. The design iterations select parameter values for slices of one or more stages of the design flow. In the design iterations for at least one of the slices, parameter values for a non-final stage of the design flow are selected based on a final quality of result (QoR) of the design flow. The design iterations for this slice are adapted based on final QoRs produced by the design iterations.

18 Claims, 15 Drawing Sheets

AUTOMATED MULTI-STAGE DESIGN FLOW BASED ON FINAL QUALITY OF RESULT

TECHNICAL FIELD

The present disclosure relates generally to an electronic design automation (EDA) system for designing electronic circuits. In particular, the present disclosure relates to the design of circuits using a multi-stage design flow.

BACKGROUND

The design flow for integrated circuits includes a sequence of stages, such as floor planning, synthesis, placement, clock tree synthesis and routing. The design process for an individual stage is based on finding a circuit design for that stage, based on optimizing a cost function or metric for that stage. These optimization problems can be complex and difficult to solve. The design process for each stage requires time, compute resources, engineering expertise and, even then, the end result may be far from optimal.

Due to the compartmentalization of the design flow into distinct stages, the design problems for different stages are solved sequentially, with the design resulting from one stage used as the starting point for the next stage. These processes are repeated multiple times as the overall design progresses. However, this approach can be inefficient since the results of later stages may lead to the redesign of earlier stages, and each additional iteration of each stage adds to the overall turnaround time and compute cost of the design flow.

SUMMARY

Some aspects include the execution of a plurality of design iterations for a flow to design a circuit. The design flow includes a sequence of at least two stages. Each stage produces an output design of the circuit from an input design of the circuit, in accordance with parameters for that stage. The design iterations select parameter values for slices of one or more stages of the design flow. In the design iterations for at least one of the slices, parameter values for a non-final stage of the design flow are selected based on a final quality of result (QoR) of the design flow. The design iterations for this slice are adapted based on final QoRs produced by the design iterations.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
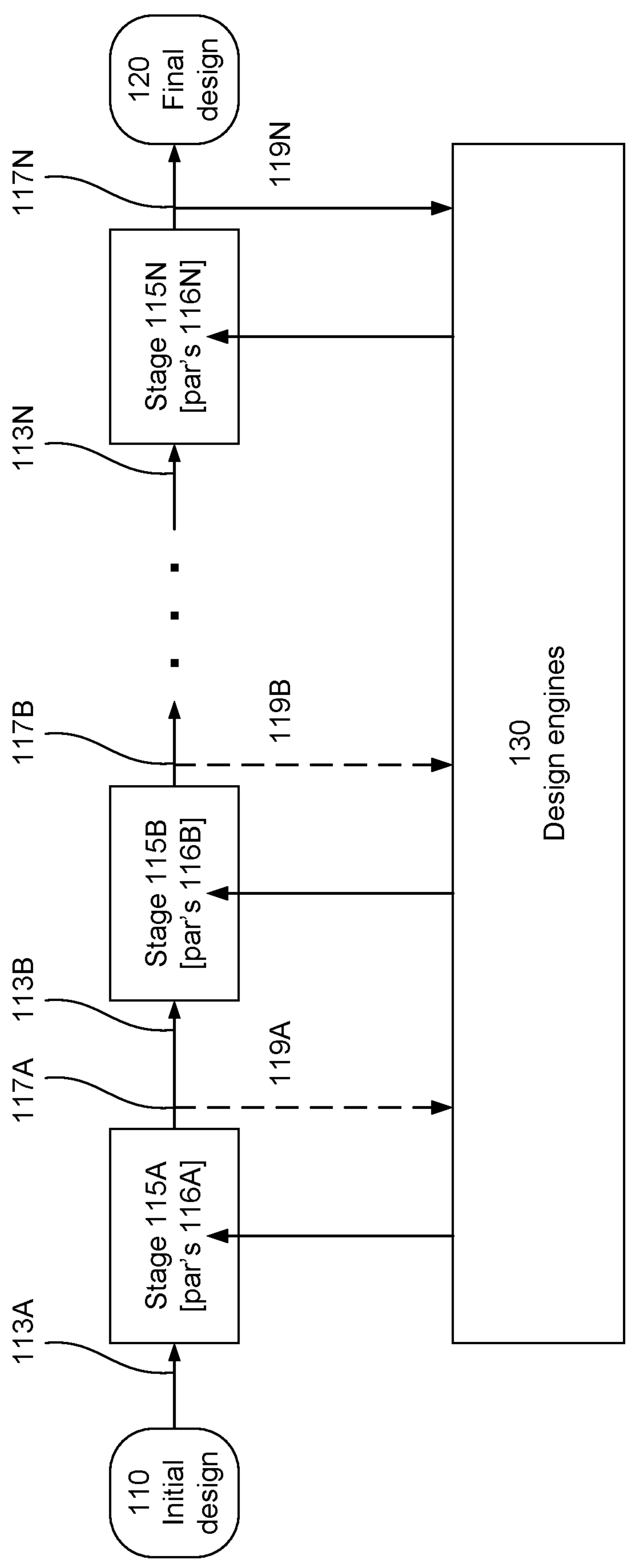
FIG. 1 is a diagram of a design flow, according to embodiments of the present disclosure.

Aspects of the present disclosure relate to automated multi-stage design flow based on final quality of result. The process of designing integrated circuits includes a sequence of multiples stages, where the result of one stage is used as the starting point for the next stage. For example, the physical design of a circuit may be divided into a compile stage that includes synthesis (which can include logical synthesis and some degree of physically-aware synthesis or physical synthesis) and placement, a clock tree synthesis (CTS) stage, and a routing stage.

In some approaches, each of these stages is performed separately. The compile stage is considered first. The starting point is a pre-synthesis (e.g., unplaced) version of the circuit design: the pre-placement netlist. Different options for the compile stage are considered and evaluated in an iterative manner, resulting in a compiled design that is based on a first metric (e.g., a timing metric) for compiled designs. This is then used as a starting point for the CTS stage. Different clock tree structures are considered in this stage, eventually yielding a design based on a second metric for clocked designs. This design is then used as a starting point for the last, routing stage. Different routings are considered, based on a third metric for this last routing stage. The end result is a final design that has been compiled, clocked (i.e., includes a clock tree) and routed.

However, in this approach, the first stage was designed using the first metric for that stage rather than the third metric for the final stage, because the full design flow had not yet been completed so metrics for the final stage were not yet calculated. The metrics for the first stage may not be well correlated to the final metrics of interest. As a result, the design choices for earlier stages may not yield the best final results, which then leads to a reconsideration of the earlier stages and rework of the entire design flow. Alternatively, the first stages may be performed using estimates of the final metric of interest. However, these are just estimates and they may not be accurate enough to yield good results for the first stage design.

The present disclosure describes a system and method that uses actual final metrics produced by the full design flow. In the example above, the first compile stage is designed based not on metrics for the intermediate compiled design, but on final quality of results (QoR) for final designs which have been compiled, clocked and routed. Because the design of any circuit will use multiple iterations of all of the stages, actual final QoRs can be calculated for different trial designs in earlier design iterations and these can then be used to guide later design iterations, including for earlier stages in the design flow.

Technical advantages of the present disclosure include, but are not limited to, the following. The use of actual final QoRs from final designs produced by the full design flow is more accurate compared to estimates or approximations of these metrics. The higher accuracy improves the design iterations for these earlier stages. In addition, the use of the final QoR rather than intermediate QoRs to guide the design of earlier stages also improves the design iterations for these earlier stages. These improvements, in turn, will search the space of possible designs more effectively, converging more quickly to acceptable designs. This reduces the amount of compute resources used to implement the design flow and also reduces the turnaround time for the design flow.

FIG. 1 is a diagram illustrating a circuit design flow according to embodiments of the present disclosure. The design flow starts with an initial circuit design 110 and includes a sequence of multiple stages 115A-N that transform the design at each stage to produce a final design 120. In the above example for physical design, the initial design 110 is a pre-synthesis netlist and the final design 120 is a placed and routed design with clock tree. This transformation is accomplished using three stages: compile, CTS and routing. Each stage 115 receives a version of the design 113 of the circuit as input, and produces an output version 117 of the design. For the compile stage, the input design is a pre-synthesis design (netlist) of the circuit and the output design is the placed version of the circuit design. For the CTS stage, the input design is the placed design from the compile stage, and the output design additionally includes the clock tree structure. For the routing stage, the output design additionally adds routing between the placed cells in the circuit design.

The design flow is implemented by a suite of electronic design automation systems: a synthesis tool, a placer tool, a CTS tool and a routing tool in the physical design example. The design collateral may also include tool scripts and design data including design libraries, design constraints, floorplans, etc.

Each stage 115 of the full design flow is characterized by a set of parameters (par's) 116. The parameters 116 control the operation of that stage. For the same input design, different parameters will yield different output designs for stage. The parameters have a datatype and a range. For example, in the compile stage, the application option to control a strategy intended to improve the delay of the design, possibly at the cost of additional runtime, is the parameter named compile.flow.high_effort_timing. This parameter can be either on or off, so it has a range of 0 or 1.

Other examples of parameters include the following. Compile parameters include mux mapping control, library Vt class mapping control: placement parameters include congestion-reduction effort, timing-optimization effort: clock-tree synthesis parameters include target skew, max transition; and routing parameters include clock uncertainty scaling and number of iterations of the optimization/reroute command.

Each stage 115 may also have metrics or QoR 119 for the output design 117 from that stage. The metrics 119N for the final stage 115N will be referred to as the final QoR. Metrics 119A-M for any of the earlier, non-final stages 115A-M will be referred to as intermediate QoRs.

The "design" of a stage can be described as selecting the parameters for that stage that will yield a sufficiently good final design. This is performed by a set of design engines 130 that execute design iterations. Different design engines are used to execute design iterations of different stages or combinations of stages, which are referred to as subflows or slices. Thus, one design engine may be used to design (i.e., select parameters for) the subflow (slice) of CTS+routing and another design engine may be used to design the subflow of compile+CTS. Design engines may be used to design individual stages. They may also be used to design the full flow. The terms "subflow" and "slice" are meant to include all of these, ranging from individual stages to the full flow of all stages.

The design engines select parameters 116 based on QoRs 119. For a design engine that is local to a single stage, it may select the parameters for that stage based on the intermediate QoR for that stage. A local design engine for the compile stage selects the "best" parameters 116A for the compile stage 115A, where "best" is defined based on the intermediate QoR 119A for the compile stage, and so on for the other stages. This type of design engine may be used as part of the design flow, but it has the drawbacks described above. For example, a local compile design engine may select parameters 116A that are optimal for the intermediate QoR 119A but are suboptimal for the final QoR 119N. For this reason, the intermediate QoRs are shown as dashed in FIG. 1.

As a result, some or all of the design engines 130 select parameters for non-final stages 115A-M based on the final QoR 119N, as described in more detail below. These design engines will be referred to as final QoR-based design engines. This approach uses a future reward (final QoR) to determine an optimal action (parameter values) for earlier stages, which is an important concept of reinforcement learning. In the above example, a final QoR-based design engine may select parameters 116A for the compile stage 115A, based on the final QoR 119N. This design engine may also select parameters 116B-N for all the other stages in the subflow. That is, a final QoR-based design engine for the compile stage may select parameters for the compile stage, the CTS stage and the routing stage. In some cases, there may be a final QoR-based design engine for each stage in the design flow: one for compile, one for CTS and one for routing in the physical design example.

As more design iterations are executed, the system collects more data about which parameter values 116 produce what resulting QoRs 119, including the final QoR 119N. Accordingly, the final QoR-based design engines are adapted based on this collected data, including data produced by design iterations executed by other design engines.

Figure 2:
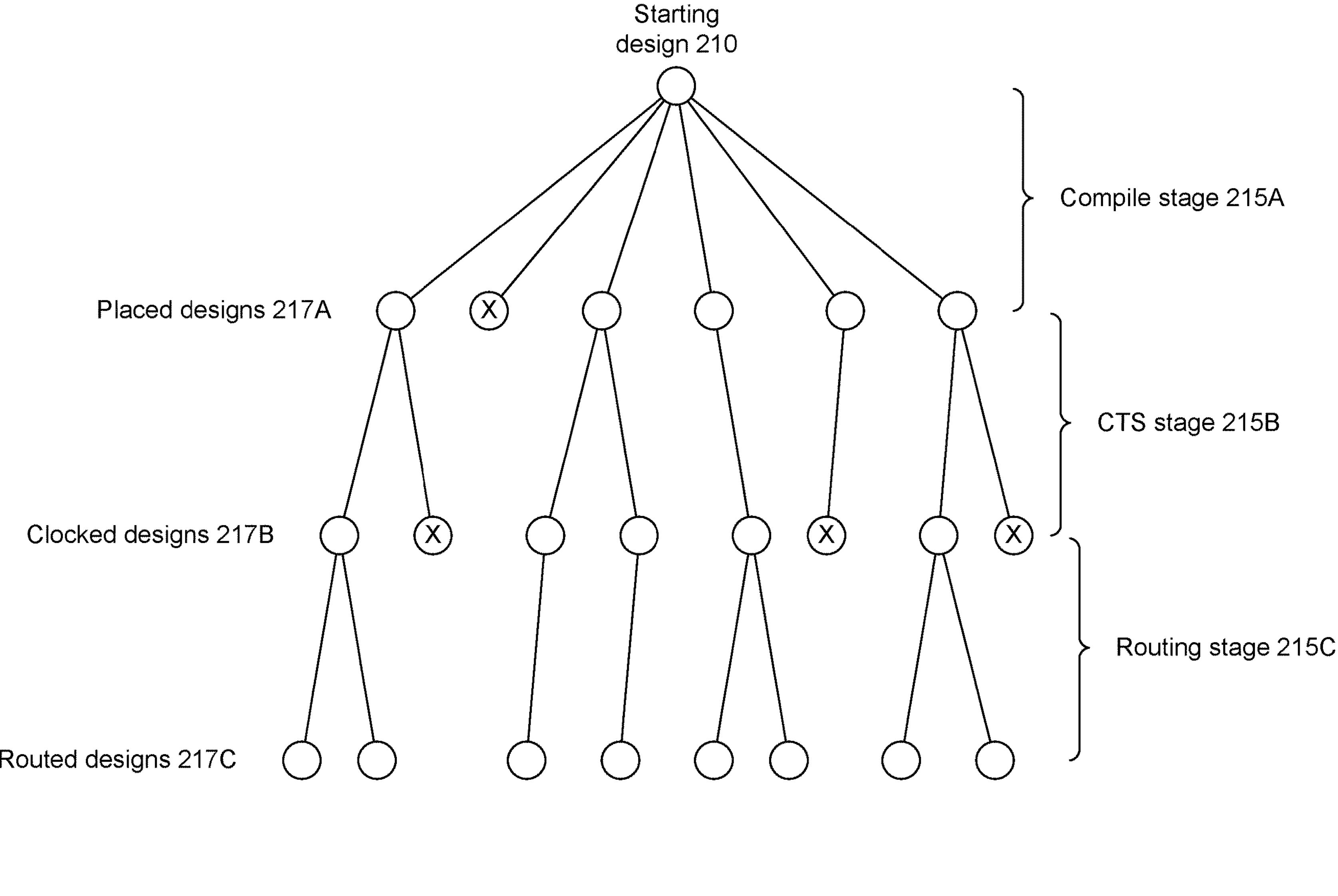
FIG. 2 is a tree representation of a design problem, according to embodiments of the present disclosure.

The overall design problem can be represented as a tree, as shown in FIG. 2. The root node 210 is the starting design—the pre-placement netlist in the physical design example. The progression to each layer of the tree represents one of the stages: compile 215A, CTS 215B and routing 215C. Each layer of the tree represents the output circuit designs produced by a stage. From top to bottom (root to leaf) in FIG. 2, the layers are placed designs 217A produced by the compile stage 215A, clocked designs 217B produced by the CTS stage 215B, and routed designs 217C produced by the routing stage 215C. Each node within a layer represents a different output design 217 produced using different parameters for that stage. These are also possible input designs to the next stage. Each edge between two nodes represents the parameter values that transform the design from the input design (the upper node connected to the edge) to the output design (the lower node connected to the edge).

At the beginning of the design problem, only the root node 210 is known. Each design iteration reveals additional branch(es) in the tree. Iterations that reach the leaf nodes 217C also provide samples of the final QoR of these leaf nodes. The problem of discovering parameter values for each stage that yield a good final design (leaf node) can be formulated as a tree search problem. This problem is solved by learning an implicit representation of the quality of intermediate design states as determined by the final QoR, and by sampling the tree incrementally while balancing exploration and exploitation to systematically improve the quality of leaf nodes discovered.

Figure 2A:
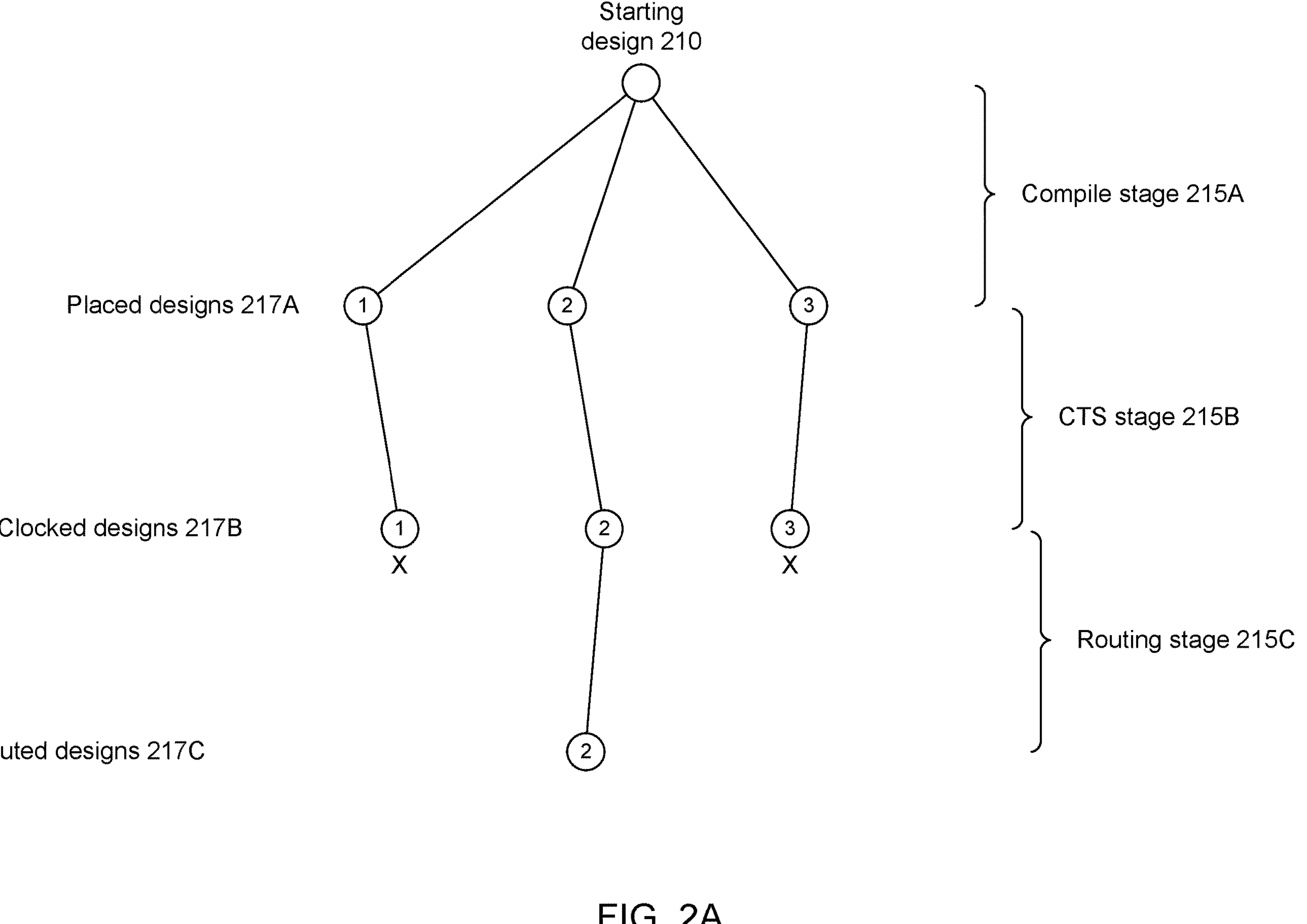
FIGS. 2A-2D show progression of design iterations using the tree representation of FIG. 2.

FIGS. 2A-2D show an example of design iterations to solve the tree search problem. FIG. 2A shows a first set of design iterations. The intention is for each design iteration to complete the full flow yielding a QoR estimate for the leaf node. Three design iterations (1)-(3) are started. The numbers inside each node in FIG. 2A identify the design iteration. In this example, these design iterations rely on local design engines because there is no data from prior design iterations. A local compile design engine selects compile parameters leading to designs 217A(1)-(3), which are the nodes labelled 1, 2, 3 in the row of placed designs 217A. A local CTS design engine uses these as starting points and select CTS parameters to produce designs 217B(1)-(3). The QoRs for designs 217B(1) and (3) are too poor (e.g., do not meet a threshold QoR), so those iterations are terminated early, as indicated by the X below those nodes. The local compile design engine may receive user-defined rules for early termination. These rules are referred to as stop rules. The local routing design engine selects routing parameters to complete iteration (2), which ends in leaf node 217C(2) and the corresponding final QoR.

Figure 2B:
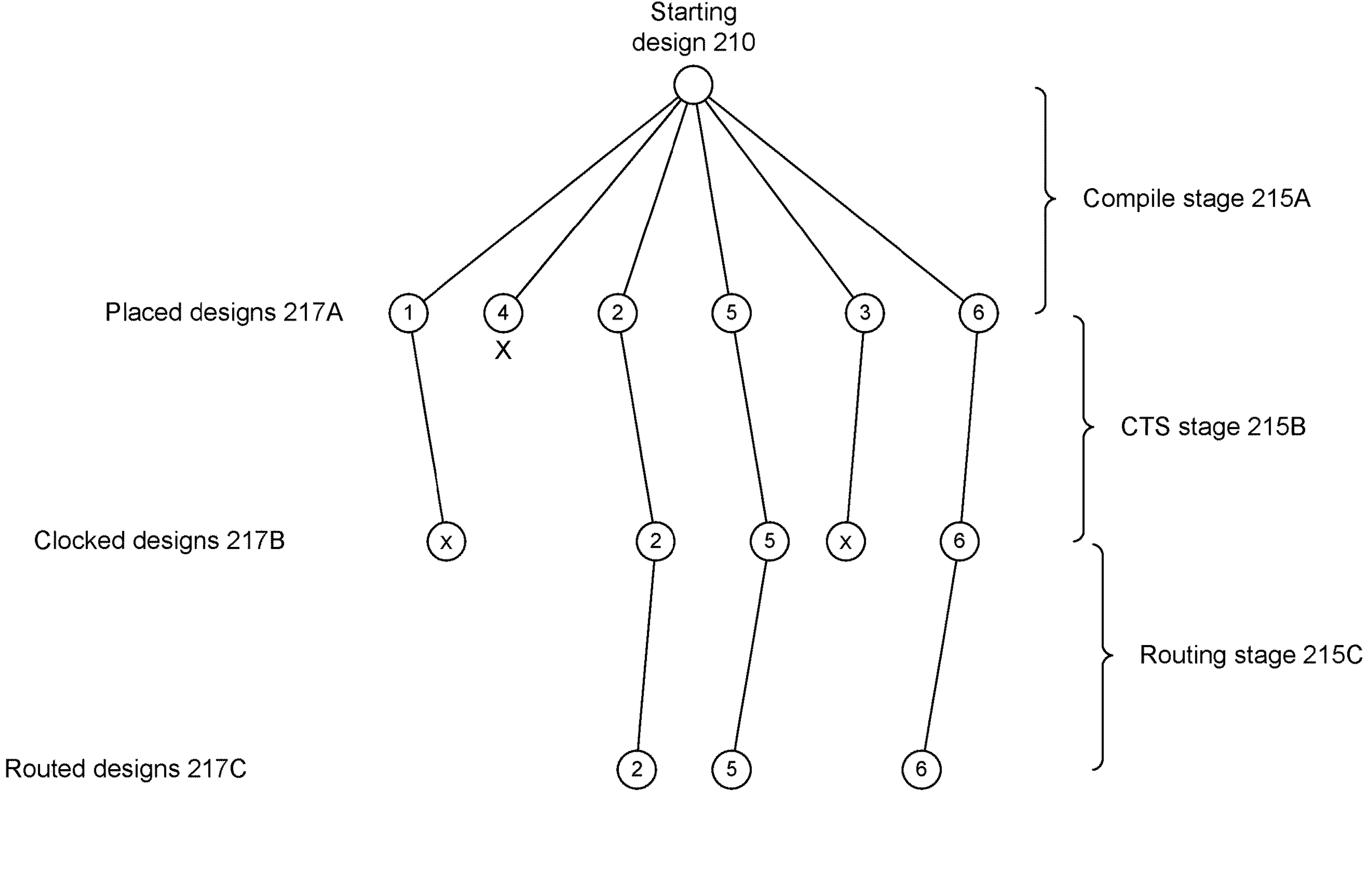

FIG. 2B shows a second set of design iterations. Another three design iterations (4)-(6) are started. These could be based on local design engines, as in the first set of iterations. Alternatively, they could be based on final QoR-based design engines since some final QoR information is now available. In this set of designs, iterations (5) and (6) progress to the leaf nodes 217C(5) and 217C(6), producing more final QoR data. Iteration (4) is terminated early. This may be based on a poor intermediate QoR for the design, or it may be based on a poor estimated final QoR.

Figure 2C:
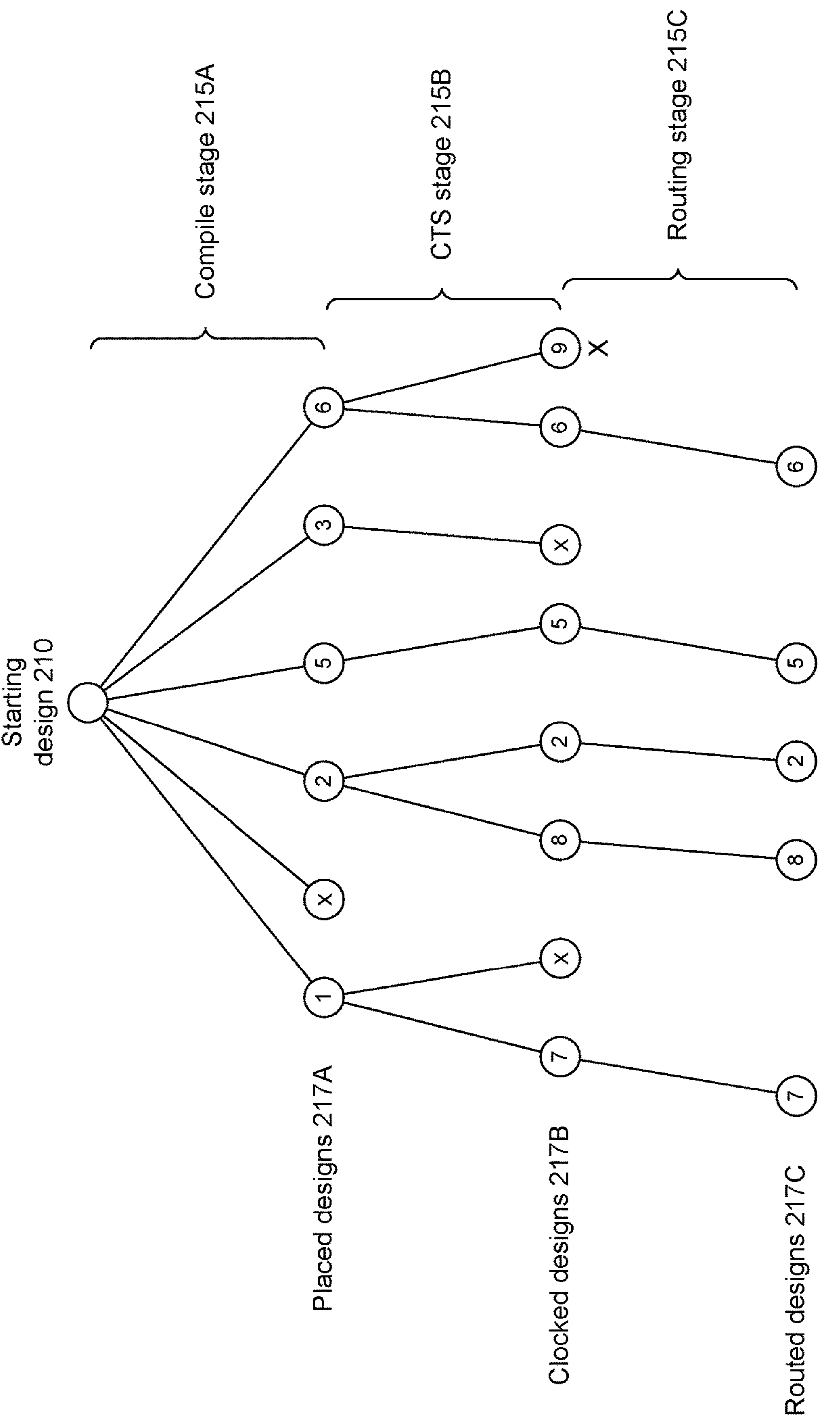

FIG. 2C shows a third set of design iterations (7)-(9). In this set, no new placed designs 217A are generated from the compile stage 215A. For example, the user may have placed a limit on the number of iterations of the compile stage or on compute resources available for the compile stage. Alternatively, the placed designs from the compile stage may have progressed sufficiently, so that additional iterations have diminishing returns. As a result, the design iterations (7)-(9) are for the CTS and routing stages 215B-C, starting from promising existing placed designs 217A. In particular, placed designs 217A(1), (2), (6) were part of previous iterations that resulted in leaf nodes (i.e., not terminated early), so they are used as starting points for this set of design iterations. A final QoR-based design engine is used for these design iterations, suggesting parameters for both the CTS stage and routing stage for each of these three starting points. Iterations (7) and (8) progress to leaf nodes, and iteration (9) is terminated early.

Figure 2D:
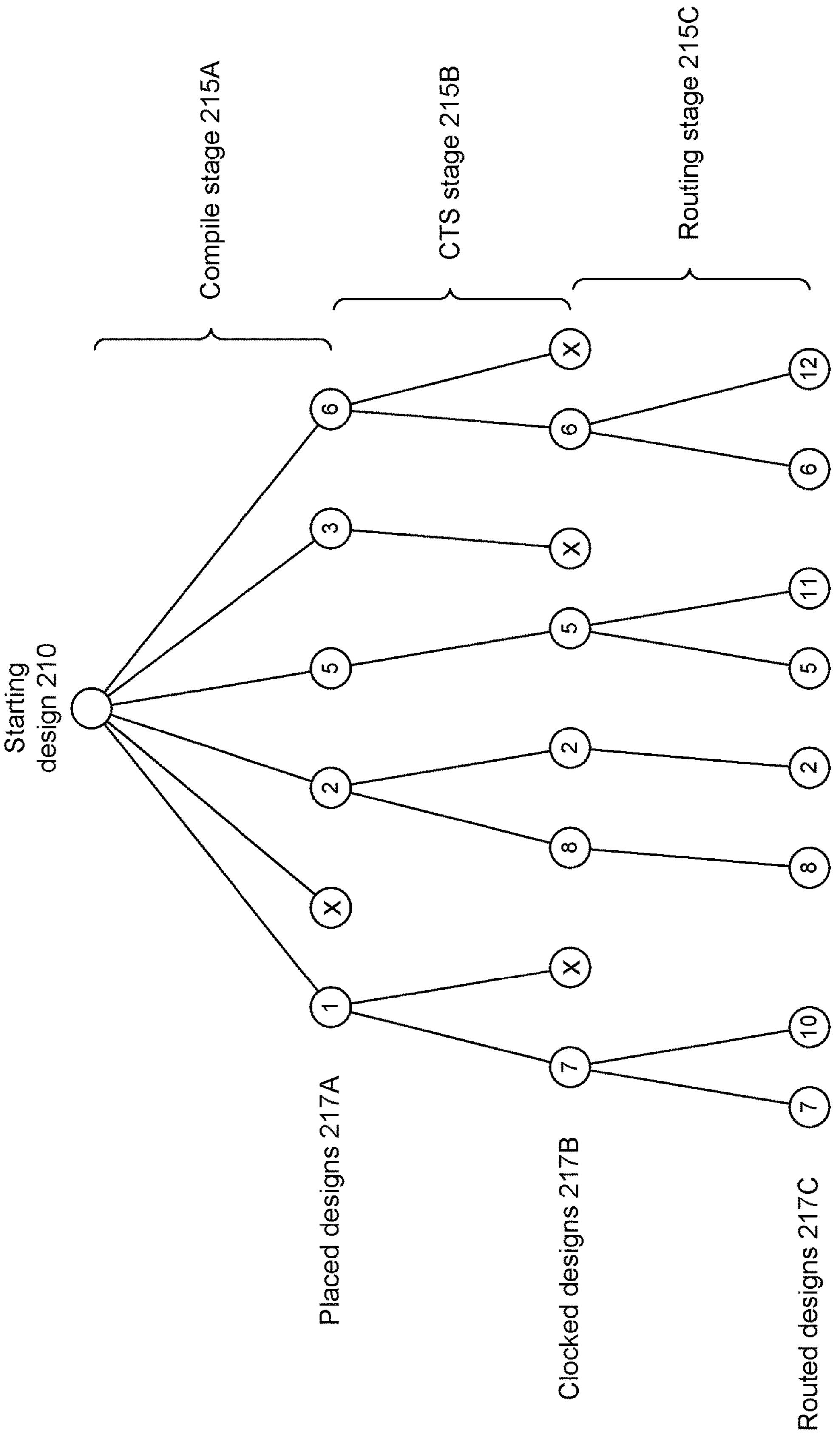

FIG. 2D shows a fourth set of design iterations (10)-(12) that involves only the final routing stage 215C. The most promising clocked designs 217B(7), (5), (6) are used as starting points, yielding leaf nodes 217C(10), (11), (12).

Figure 3:
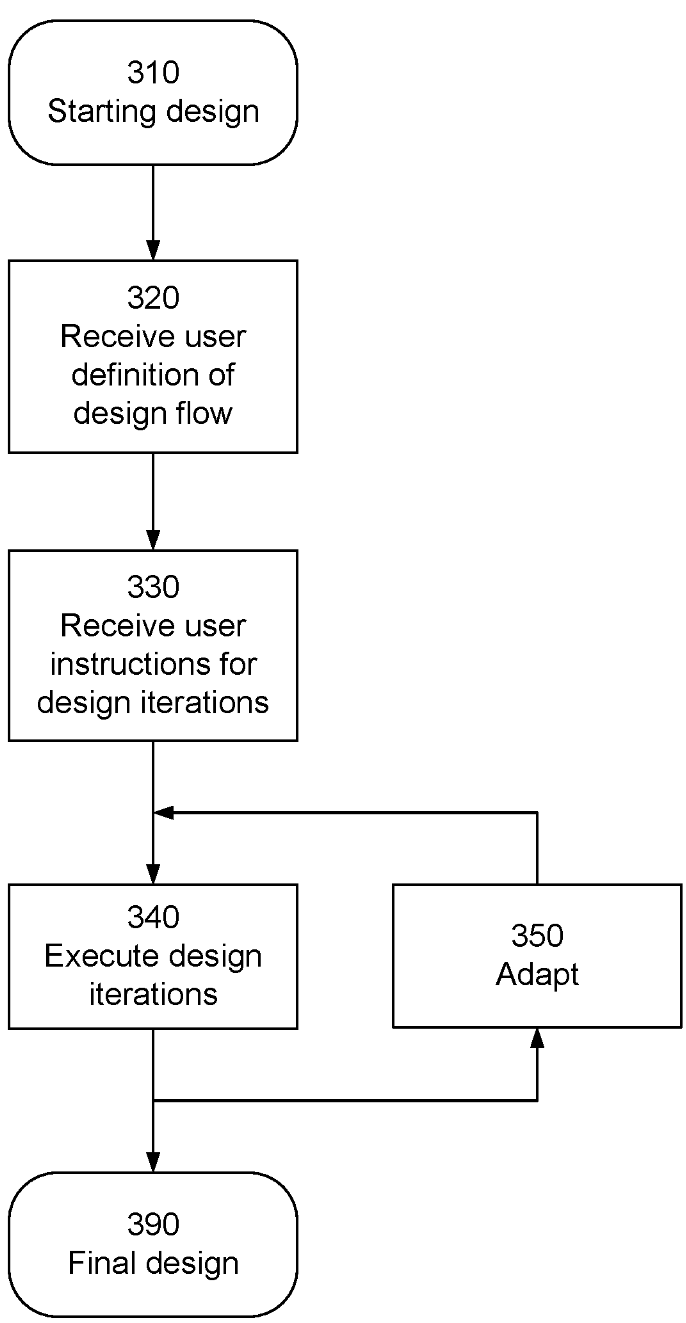
FIG. 3 is a flow diagram of a design flow with user input, according to embodiments of the present disclosure.

As shown in the example of FIG. 2, instructions, such as from a user, may be provided for the design iterations. FIG. 3 is a flow diagram of a design flow with user instructions, although instructions may be provided by machines or other sources in other embodiments. The starting design 310 may be contained in a design database. At 320, the present system receives definitions (e.g., from a user) for the design flow, some examples of which are described below. This includes stages in the design flow, parameters for the stages, the final QoR, and a goal for the final QoR.

In the physical design example, the final QOR used to quantify the quality of design may be constructed using power, performance and area metrics of the last stage. These metrics may be combined through an aggregation scheme that allows normalization and sensitivity definition for each metric via a set of weight, baseline and target values. For example, in the physical design example, the final QoR may be based on a combination of routing congestion, total negative slack (TNS), total power and total standard cell area.

At 320, the present system receives compute limits (e.g., from a user) on the design iterations or otherwise specify the compute pool available for the design iterations. This may include compute resource type, such as the type of compute resource, memory, threads, etc. It may include compute resource width, such as the number of machines that can be utilized simultaneously. Another example is a limit on the number of iterations—the number of design iterations to execute before exiting.

At 330, the present system receives instructions (e.g., from a user) relating to the design iterations. These instructions guide the progression of the design iterations, as described in more detail below.

At 340, the design iterations are executed according to the instructions. Some of the design iterations are based on final QoR. At 350, these final QoR-based design iterations are adapted based on the final QoRs produced in previously executed design iterations. The loop of 340,350 indicates that there are multiple design iterations.

In one approach, the earlier sets of design iterations are designed to maximize the coverage over the search space defined by the parameters. This allows the design engines to maximally observe the sensitivity of the final QoR to the parameters. A tree data structure may be used to keep track of the design iterations and their QoRs as the iterations progress. Later sets of design iterations are used to explore promising areas of the search space.

Design iterations of the final stage produce samples of the final QoR. As these iterations complete, an internal representation of the final QOR distribution with respect to parameters for each stage may be built. Parameter values that result in lower final QoR scores are used to seed later design iterations.

Machine learning, such as reinforcement learning, may be used to construct the QOR distribution with respect to the parameters. Based on this learning, the design engines can then select parameter values for early stages based on the final QoR values. This can eliminate or reduce the need to define or depend on intermediate QoRs. This approach also allows learning of the QoR/parameter correlation over time, which can be used to efficiently guide the tree search.

This approach to adaptive learning framework also works with design flows at different levels of maturity through the progression of the design cycle. For example, routing information may not be available for early design iterations. For these iterations, the design engines may select compile and CTS parameters based on post-CTS QoR metrics, rather than post-routing final QoR metrics. However, once routing designs become available, the design engines may include routing in the design process. The learning algorithm adapts to include knowledge already learned from the prior designs up to the CTS stage.

Returning to the user instruction 330 of FIG. 3, examples of user instructions include stop rules, stage fusion, and instructions about the order of iterations. Stop rules are rules that specify early termination of a design iteration. This is a way to prune the search tree. For example, a design iteration may be early terminated because the performance is too poor or because certain hardware requirements are violated or because the design is too similar to a previous design. Other stop rules might be based on excessively bad scoring in metrics that signal runaway optimization (like congestion, total negative slack, routing DRCs). Stop rules may also be based on excessive runtime for a given stage, which itself can be an indicator of a problem.

Stage fusion is a way to define the subflow considered by different sets of design iterations. Stage fusion specifies which stages are considered in a subflow and which QoR is used to design those stages. For example, if the compile and CTS stages are fused for a set of design iterations, then those design iterations consider the subflow that includes the compile and CTS stages and uses an intermediate QoR from the CTS stage as the metric for the design. The design engine may select parameters for both the compile stage and the CTS stage. Stage fusion may be used to guide the overall design flow as the design iterations progress.

Figure 4A:
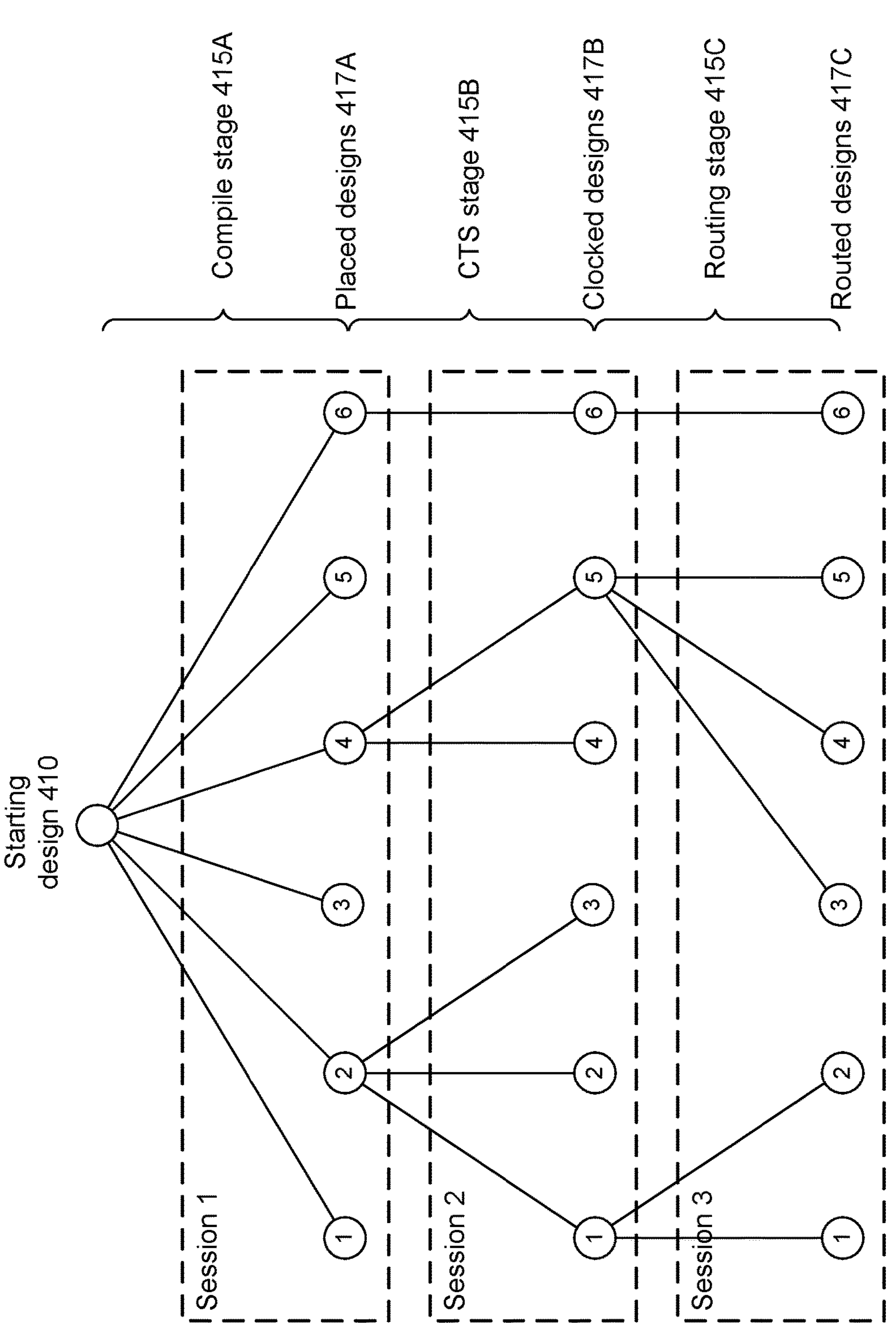
FIGS. 4A-4D show design flows with different fused stages, according to embodiments of the present disclosure.

FIGS. 4A-4D show some examples of controlling the overall design flow using stage fusion. In these examples, each set of design iterations is completed in a separate set of iterations, referred to as sessions in these figures. FIG. 4A shows a breadth first search. Session 1 considers only the compile stage 415A and the design iterations (1)-(6) of session 1 produce the corresponding placed designs 417A shown as nodes labelled (1)-(6). The design iterations of session 1 use an intermediate QoR for placed designs. Session 2 then considers the CTS stage 415B. The starting points are placed designs from session 1, which are designs 417A(2),(4),(6). The design iterations (1)-(6) of session 2 produce the clocked designs 417B shown in FIG. 4A. Session 3 then considers the routing stage 415C. The starting points are clocked designs from session 2, and the design iterations (1)-(6) of session 3 produce the routed designs 417C shown in FIG. 4A.

Figure 4B:
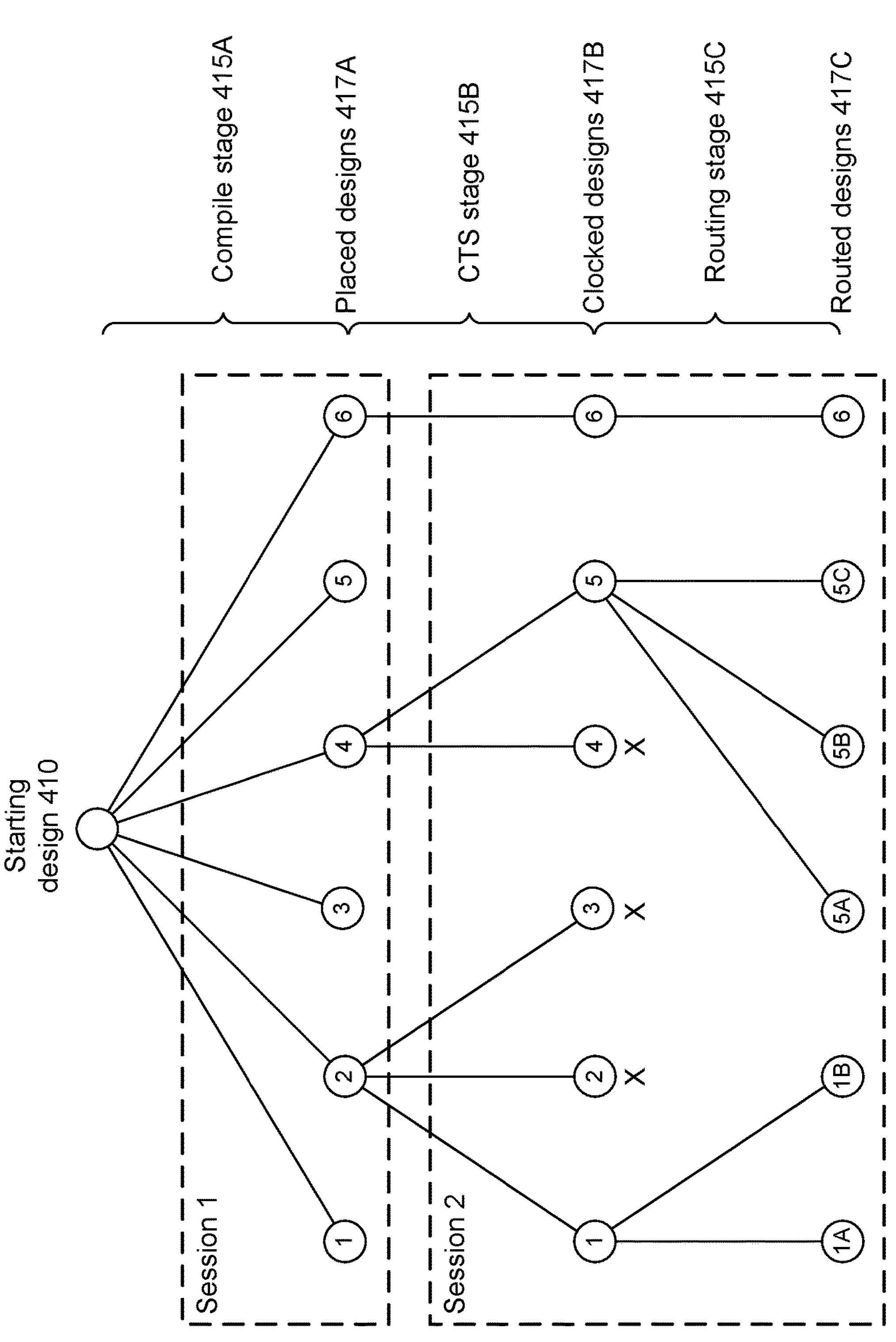

FIG. 4B shows an example where the CTS stage 415B and routing stage 415C are fused for session 2. Session 1 is the same as in FIG. 4A, producing placed designs 417A(1)-(6). In this example, placed designs 417A(2),(4),(6) are used as the starting points for session 2. Session 2 designs the CTS and routing stages 415B,C using the final QoR from the routing stage. In this example, design iterations (1)-(6) of session 2 start with the CTS stage 415B. The resulting clocked designs 417B(2),(3),(4) are too poor, so those design iterations are terminated early by stop rules. Design iteration (1) continues, branching to produce two routed designs 417C(1A) and (1B). Similarly, design iteration (5) branches to produce three routed designs, and design iteration (6) produces a single routed design.

Figure 4C:
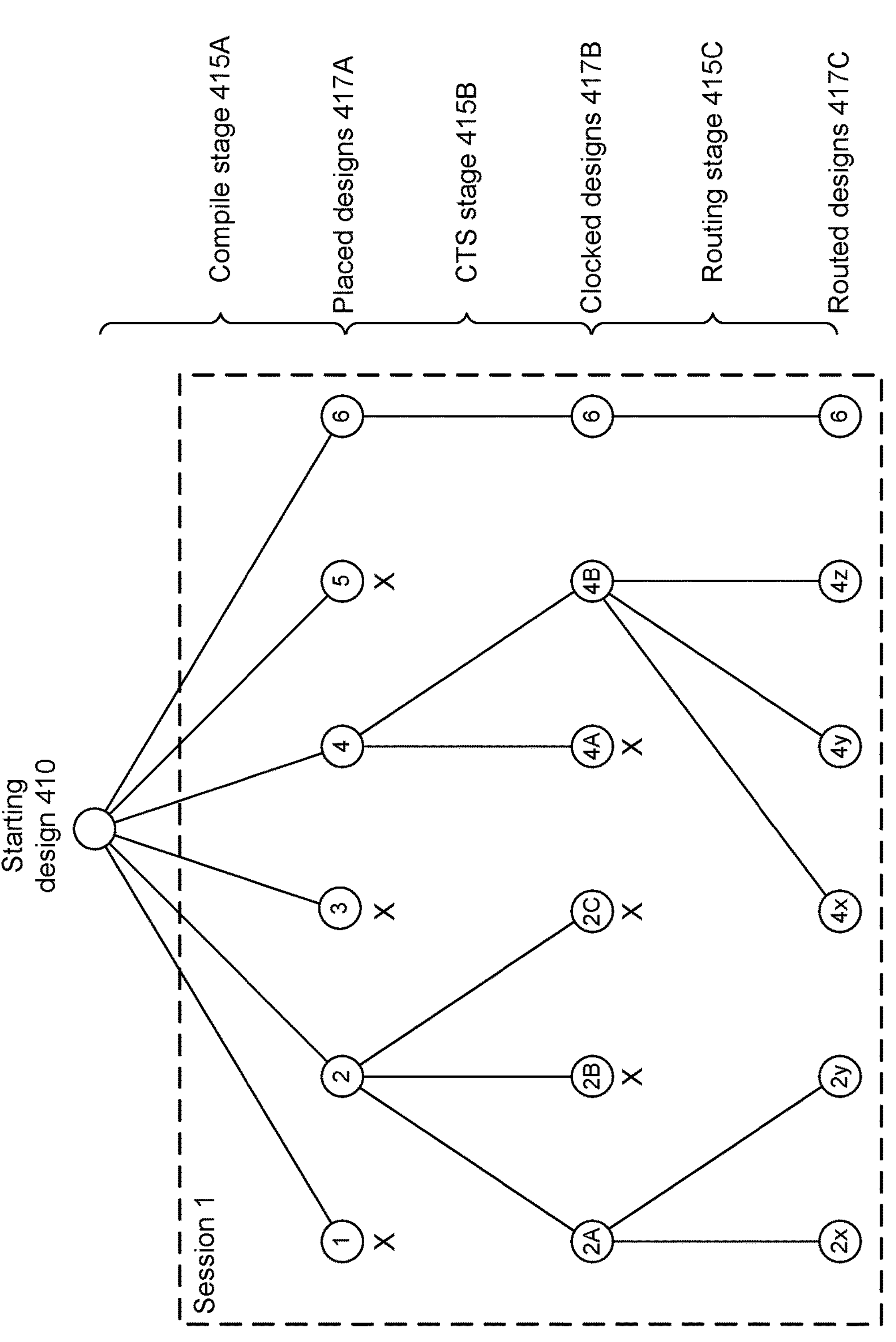

FIG. 4C shows an example where all three stages 415A-C are fused. There is a single session that designs all three stages. Working from the top of the tree downwards, three of the placed designs 417A are stopped from progressing. The design iterations for the other three continue through the CTS stage 415B, branching in some cases. For example, placed design 417A(2) produces three clocked designs 417B (2A)-(2C). Some of the clocked designs 417B are stopped, and others progress to the routed designs 417C. Since the stages are fused, the design iterations in session 1 are based on the final QoR for the routed designs.

Figure 4D:
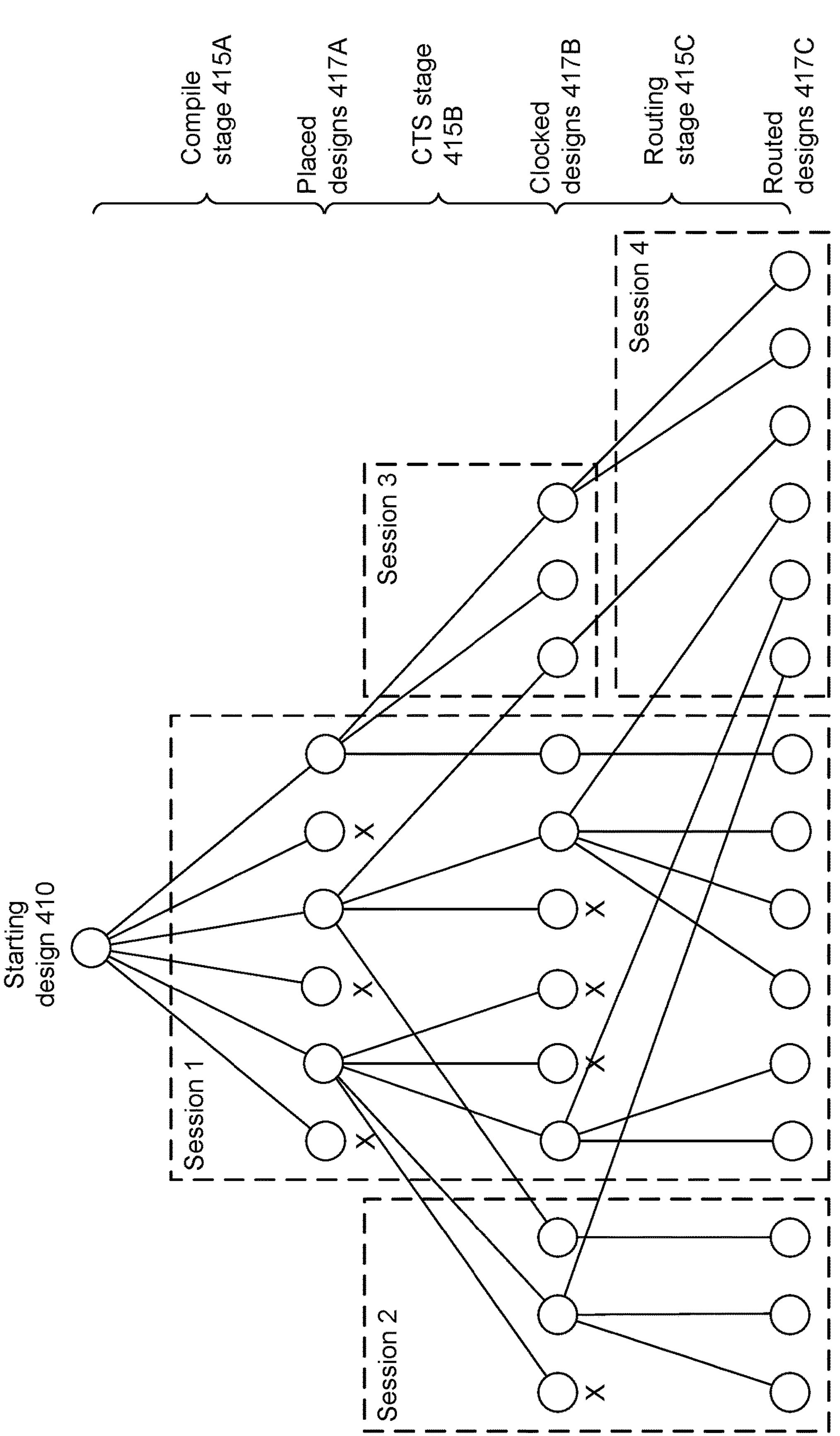

FIG. 4D shows a more complex search, using session 1 of FIG. 4C as the first session. Session 2 fuses stages 415B,C, using placed designs 417A as the starting point. Session 3 considers only the CTS stage 415B, also using placed designs 417A as the starting point. Session 4 then considers only the routing stage 415C, using clocked designs from any of the previous sessions 1-3 as starting points. Different sessions may fuse different stages, but they may also consider different search spaces for the parameters. The parameters considered and/or the range of parameters may be different for different sessions. The QoR cost function for a stage may also change for different sessions. These degrees of freedom may be useful as the design progresses. Early sessions of the design flow may focus on broadly exploring the search space to determine which areas of the search space are more promising. Later sessions of the design flow may focus on iterating the design to achieve a desired final QoR.

Figure 5A:
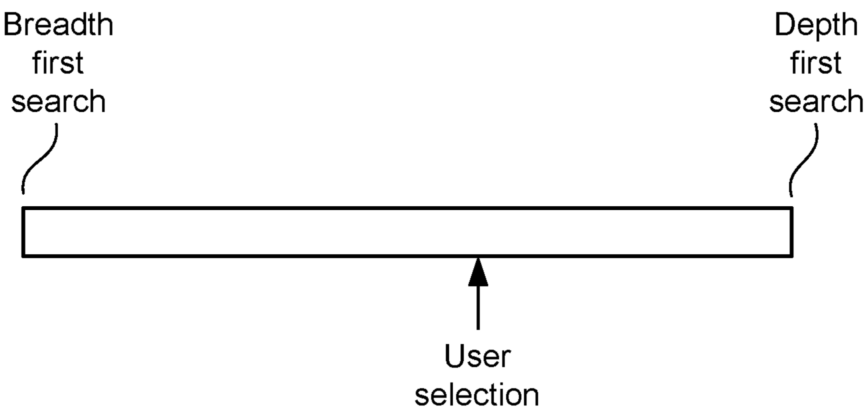
FIG. 5A is a slider showing a scale with breadth-first search at one end and depth-first search at the other end, according to embodiments of the present disclosure.
Figure 5B:
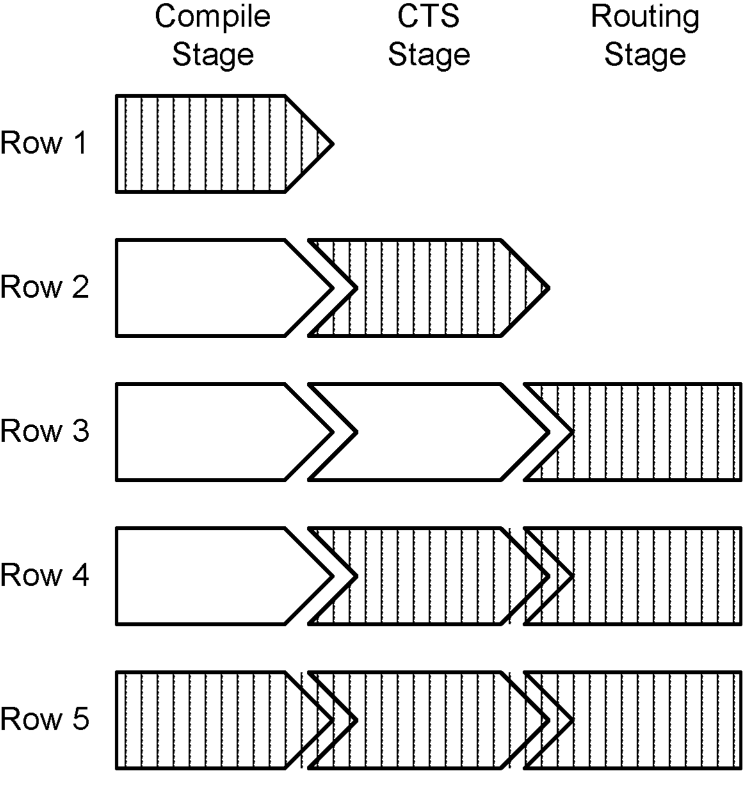
FIG. 5B shows a user-specified schedule for design iterations, according to embodiments of the present disclosure.

FIGS. 5A and 5B provide two additional examples of user instructions about the order of iterations. FIG. 5A is a slider showing a scale with breadth-first search at one end and depth-first search at the other end. These are two approaches to searching a tree. This slider allows the user to specify their preference on this scale. The user may also specify that the preference changes over time, or upon certain conditions. Sets of design iterations will then be selected according to the user preference.

FIG. 5B shows a user-specified schedule for design iterations. The iterations progress from top to bottom. Each row shows three shapes, which represent the compile stage, CTS stage and routing stage, respectively. In each row, the vertically striped shapes are the stages being designed. White shapes represent designs from previous design iterations. In row 1, the user specifies that this design flow starts by considering only the compile stage. This may be done by local design engines. Once the compile stage is designed, the flow then progresses to the CTS stage in row 2. The best compiled designs are used as starting points for the design of the CTS stage. In row 3, the flow then progresses to the routing stage. The best CTS results are used as starting points.

Row 4 starts to work backwards, but using final QoR. In row 4, the CTS and routing stages are fused. They are designed together using the final QoR (rather than some intermediate QoR) for the design of the CTS stage. Row 5 considers all three stages, using the final QoR for both the compile and the CTS stages.

Another example of user instructions is priority runs. Each path (run) through the design tree is the result of certain parameter values for each of the stages. Paths that produce good results may be interesting for other starting designs and/or other versions of the current design. Thus, the user may instruct to give priority to those parameters in the design iterations. For example, if parameters {p1, p2, p3} are used for stages 1, 2 and 3 and these parameters resulted in a good design, then the same parameters may be used for iterations in other design flows. Not all of the parameters have to be used. For example, parameters {p1, p2} may be used for stages 1 and 2, followed by one or more design iterations for stage 3.

Figure 6A:
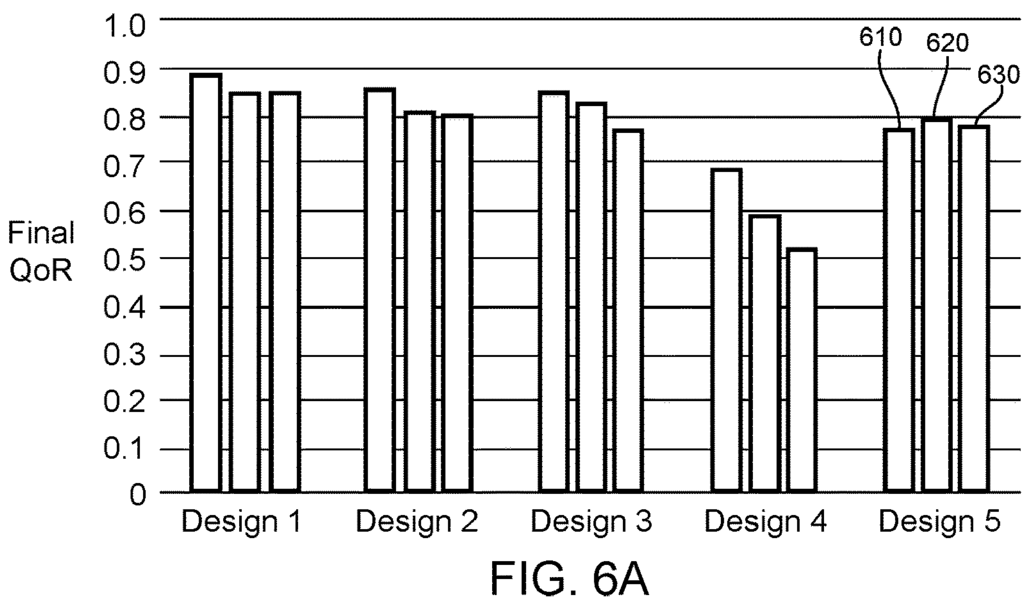
FIGS. 6A-6C are bar charts comparing performance of different design flows, according to embodiments of the present disclosure.
Figure 6B:
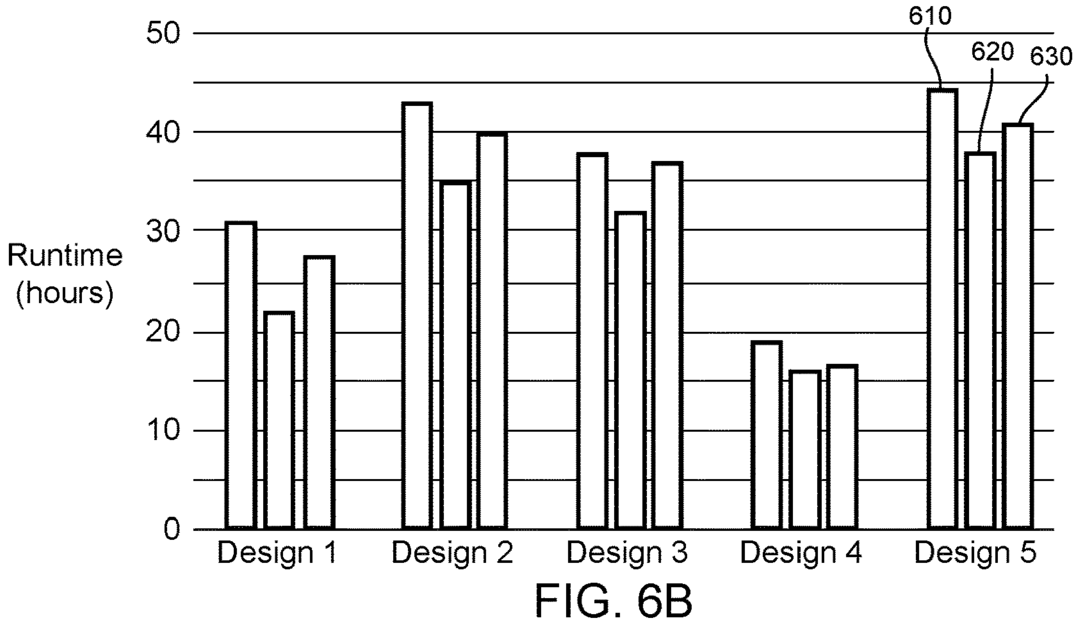
Figure 6C:
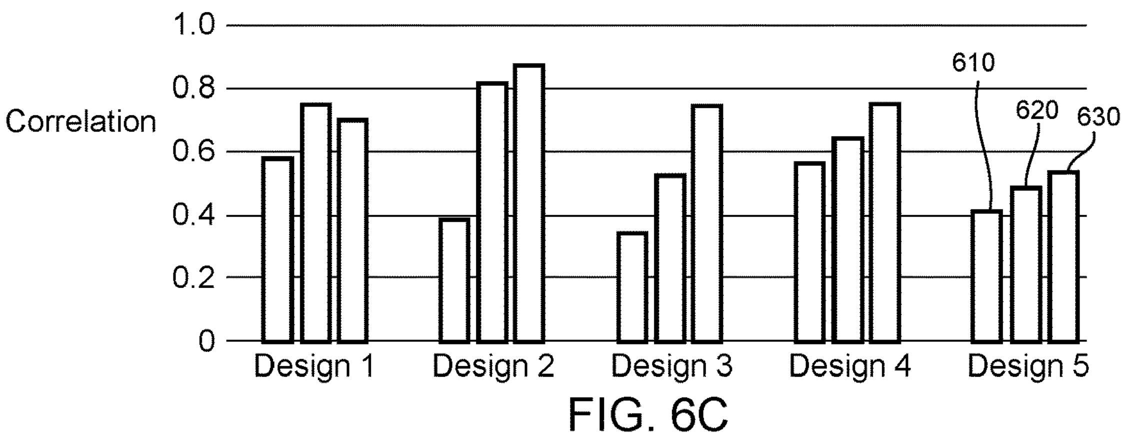

FIGS. 6A-6C show some experimental results comparing a design flow using local design engines to design flows based on final QoR-based design engines. The design flow is the three-stage physical design flow using compile, CTS and routing stages. In the local design flow, each stage is designed separately by a local design engine, one after another. In the final QoR-based design flow, full flows are completed to produces samples of the final QoR. Final-QoR based design engines use the final QoRs to design all of the stages. A third design flow is the final QoR-based design flow but including some stop rules.

For these experiments, there are approximately 15,000, 2200, and 210 different combinations of parameters for the compile, CTS and routing stages, respectively. The total number of parameter combinations across all three stages is approximately 7 billion. The final QoR is defined to include routing congestion, total negative slack (TNS), total power and the total standard cell area. The different flows are compared for five different designs.

FIG. 6A graphs the final QoR for each design flow. Each cluster of three bars shows the local QoR flow 610 on the left, final QoR flow 620 in the middle and final QoR with stop rules 630 on the right, respectively, for one of the five designs. The five clusters show these results for each of five designs. Low QoR is an indication of better performance in FIG. 6A. In four out of five designs, the final QoR flows discover designs with better final metrics. The stop rules provide additional improvement compared to the final QoR flow without stop rules.

FIGS. 6B and 6C have the same format, but FIG. 6B plots total runtime and FIG. 6C plots compile-route correlation. In FIG. 6B, both final QoR flows 620, 630 have lower runtimes than the conventional flow. Between the two final QoR flows 620 and 630, the total number of runs summed over the three stages is kept constant. In the flow with stop rules 630, every run stopped at the compile stage, is compensated by additional clock and route runs. These runs have a longer runtime than compile runs, hence the total runtime is longer for the final QoR flow with stop rules 630 compared to the final QoR flow without stop rules 620.

Upon detailed review of the best designs, the most significant improvement was in TNS. FIG. 6C shows correlation of TNS across the stages. The lower correlation for the conventional flow means that predictions of TNS made at earlier stages are not very good predictions when the full flow is run. In contrast, the final QoR flows run full flows from the beginning, thus producing actual TNS samples early in the design flow. This results in better design quality overall.

Figure 7:
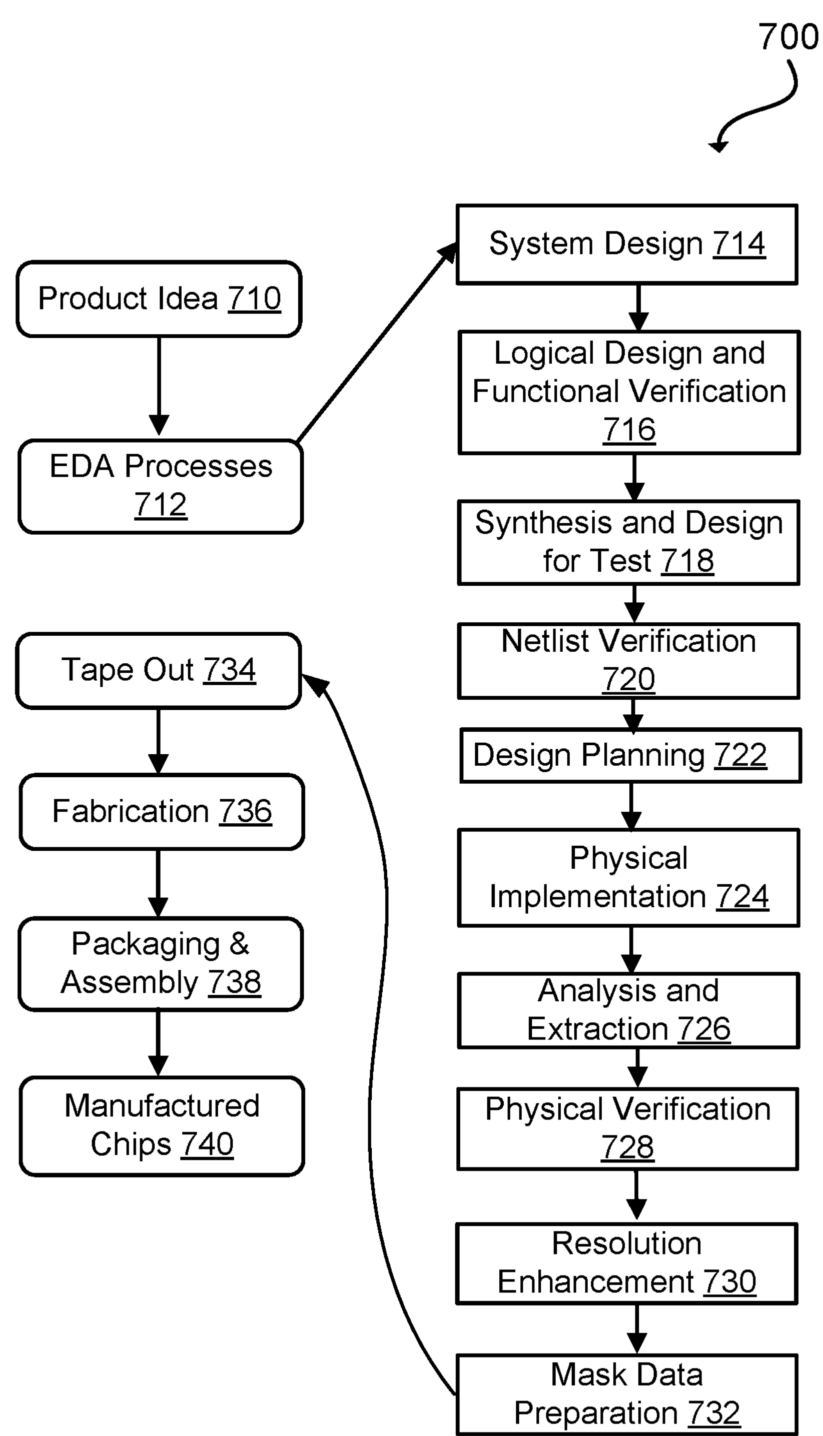
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'design' may refer to two or more cells. Both a cell and a circuit design can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
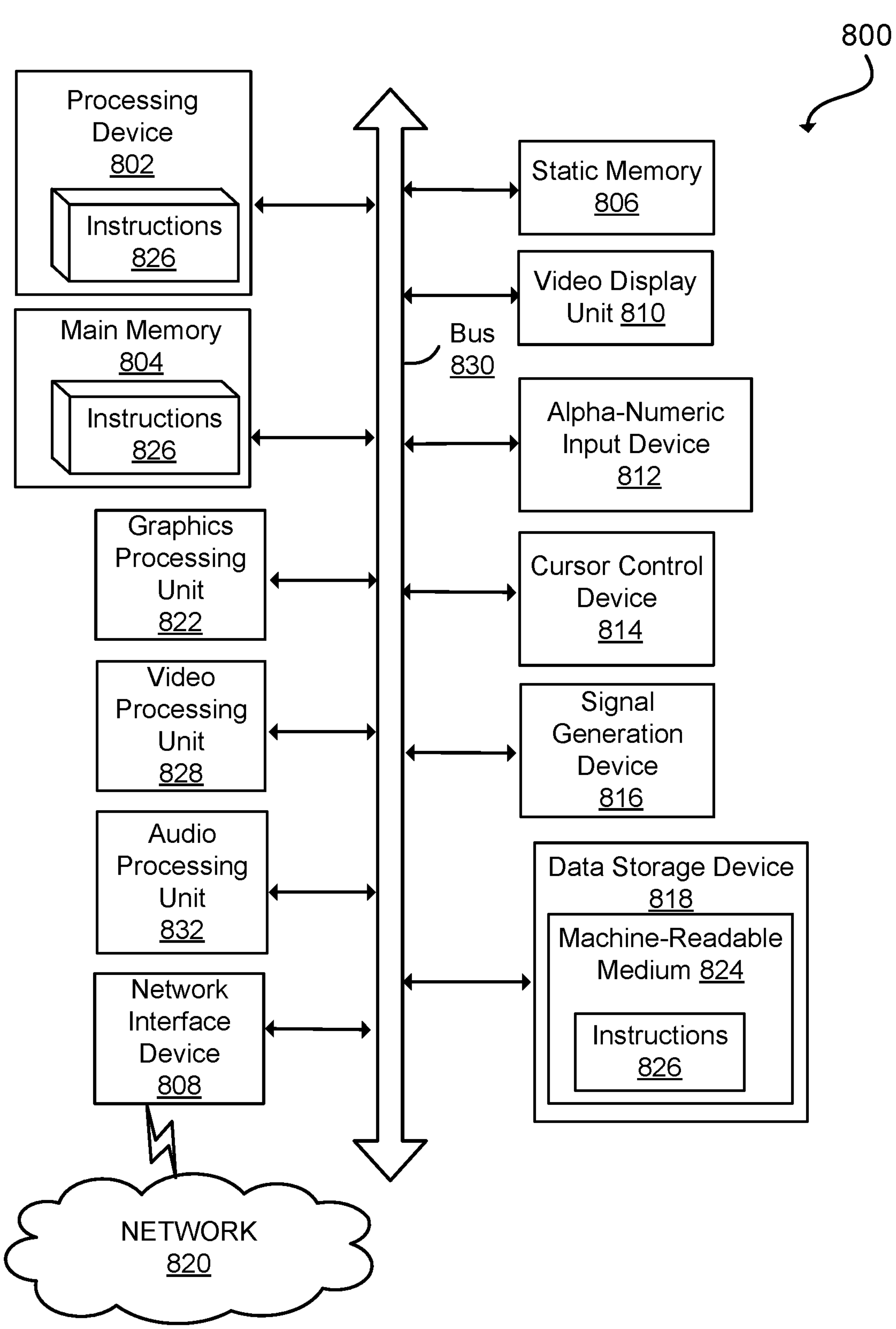
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, which may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

executing a plurality of design iterations for a design flow for a circuit; wherein:

the design flow comprises a sequence of at least two stages, and each stage produces an output design of the circuit from an input design of the circuit in accordance with parameters for that stage;

the design iterations comprise selecting parameter values for slices of one or more stages of the design flow;

the design iterations are executed according to a tree search strategy, in which the stages of the design flow represent different layers of the tree; and the design iterations for a first one of the slices comprise selecting parameter values for a non-final stage of the design flow based on a final quality of result (QoR) of the design flow; and adapting, by a processing device, the design iterations for the first slice based on final QoRs produced by the design iterations.

2. The method of claim 1 wherein the design iterations comprise selecting parameter values for each of the non-final stages of the design flow based on the final QoR of the design flow.

3. The method of claim 2 further comprising:

adapting the design iterations that select parameter values based on the final QoR of the design flow, based on final QoRs produced by the design iterations.

4. The method of claim 1 wherein:

the stages include synthesis and placement, clock tree synthesis and routing; and the final QoR is a function of routing congestion, total negative slack (TNS), total power and total standard cell area.

5. The method of claim 1 wherein the final QoR comprises an aggregate of at least two performance metrics of the output design of the circuit from a final stage of the design flow.

6. The method of claim 1 wherein the design iterations for the first slice select parameter values for all stages in the first slice based on the final QoR of the design flow.

7. The method of claim 1 wherein adapting the design iterations for the first slice is further based on final QoRs produced by design iterations for other slices.

8. The method of claim 1 further comprising:

for all design iterations that are based on the final QoR, adapting all such design iterations based on final QoRs produced by all complete sequences of stages from the design iterations.

9. A system comprising:

a memory storing instructions; and a processing device, coupled with the memory and to execute the instructions, the instructions when executed cause the processing device to:

receive instructions relating to design iterations for a design flow to design a circuit, wherein the design flow comprises a sequence of at least two stages, and each stage produces an output design of the circuit from an input design of the circuit in accordance with parameters for that stage;

execute a plurality of design iterations in accordance with the instructions; wherein each design iteration selects parameter values for a subflow of one or more stages, and the design iterations include final QoR-based design iterations that select parameter values for a non-final stage of the design flow based on a final QoR of the design flow, and the instructions specify parameter values that are given priority during the design iterations; and adapting the final QoR-based design iterations based on the final QoRs produced in previously executed design iterations by sequences that include all stages in the design flow.

10. The system of claim 9 wherein the instructions specify compute limits on the design iterations.

11. The system of claim 9 wherein the instructions specify stop rules for early termination of design iterations.

12. The system of claim 9 wherein the design flow includes a plurality of sessions that execute the plurality of design iterations, and the instructions specify which stages are included in the subflow for each session.

13. The system of claim 9 wherein the instructions specify limits on a number of design iterations that are executed.

14. The system of claim 9 wherein the instructions specify a tree search strategy for the design iterations on a scale ranging from a depth-first search to a breadth-first search.

15. The system of claim 9 wherein the instructions specify the stages in the design flow, parameters for the stages, compute limits on the design iterations, the final QoR, and a goal for the final QoR.

16. A non-transitory computer readable medium comprising stored instructions, which when executed by a processing device, cause the processing device to:

execute a plurality of design iterations for a design flow to design a circuit, wherein the design flow comprises a sequence of at least two stages, each stage produces an output design of the circuit from an input design of the circuit in accordance with parameters for that stage, each design iteration selects parameter values for a subflow of one or more stages, and the design iterations include final QoR-based design iterations that select parameter values for a non-final stage of the design flow based on a final QoR of the design flow; and adapting the final QoR-based design iterations based on the final QoRs produced in previously executed design iterations by sequences that include all stages in the design flow; and in addition to the final QoR-based design iterations, the design iterations also include local design iterations that select parameter values for a non-final stage of the design flow based on an intermediate quality of result (QoR) for that non-final stage.

17. The non-transitory computer readable medium of claim 16 wherein most of the local design iterations are executed before most of the final QoR-based design iterations.

18. The non-transitory computer readable medium of claim 16 wherein adapting the final QoR-based design iterations uses machine learning.

* * * * *